(12) United States Patent
Park (10) Patent No.: US 7,495,981 B2
(45) Date of Patent: Feb. 24, 2009

(54) INTERNAL VOLTAGE GENERATOR

(75) Inventor: Sang-Il Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 75 days.

(21) Appl. No.: 11/647,934

(22) Filed: Dec. 29, 2006

(65) Prior Publication Data

US 2008/0002495 A1    Jan. 3, 2008

(30) Foreign Application Priority Data

Jun. 29, 2006  (KR) .................. 10-2006-0059261

(51) Int. Cl.
*G11C 7/00* (2006.01)
(52) U.S. Cl. .................. 365/203; 365/227; 365/229
(58) Field of Classification Search .................. 365/203, 365/227, 229
See application file for complete search history.

(56) References Cited

U.S. PATENT DOCUMENTS

| | | | | |
|---|---|---|---|---|
| 5,594,701 A | * | 1/1997 | Asaka et al. ........... 365/230.03 |
| 5,708,615 A | * | 1/1998 | Ryoho et al. ................. 365/203 |
| 5,896,328 A | * | 4/1999 | Tanizaki et al. ............. 365/200 |
| 5,943,276 A | * | 8/1999 | Casper ........................ 365/201 |
| 5,982,349 A | * | 11/1999 | Yoon ............................ 345/98 |
| 2003/0062576 A1 | * | 4/2003 | Ishibashi et al. ............. 257/391 |
| 2005/0276134 A1 | * | 12/2005 | Mori et al. ................... 365/203 |
| 2006/0164904 A1 | * | 7/2006 | Saleh .......................... 365/226 |
| 2006/0221738 A1 | * | 10/2006 | Park et al. ................... 365/203 |

FOREIGN PATENT DOCUMENTS

| | | |
|---|---|---|
| JP | 2002-245797 | 8/2002 |
| KR | 2001-0078149 | 8/2001 |
| KR | 10-2007-0040964 | 4/2007 |
| KR | 10-2007-0049838 | 5/2007 |

* cited by examiner

*Primary Examiner*—Huan Hoang
*Assistant Examiner*—Jay Radke
(74) *Attorney, Agent, or Firm*—Blakely, Sokoloff, Taylor & Zafman LLP (57) ABSTRACT

An internal voltage generator includes an output node, a bit line precharge voltage generating unit for generating a bit line precharge voltage, and a voltage drop block for dropping a voltage level of the bit line precharge voltage according to operating modes.

21 Claims, 7 Drawing Sheets

INTERNAL VOLTAGE GENERATOR

FIELD OF THE INVENTION

The present invention relates to a semiconductor memory device, and more particularly, to a bit line precharge voltage generator of a semiconductor memory device.

DESCRIPTION OF RELATED ART

In semiconductor memory devices, the biggest issue is the large capacity and high operating speed. In addition, many efforts have been made to develop semiconductor memory devices that can secure a reliable operation in a low power environment. Specifically, memory devices mounted on portable systems, e.g., mobile phones, notebook computers, etc., have been developed to minimize power consumption.

One of these efforts is a technique to minimize power consumption in a core region of a memory device. The core region includes a memory cell, a bit line, and a word line and is designed based on an ultra-fine design rule. Therefore, the memory cell has a very small size and uses a low power.

A bit line precharge is an important technique related to a cell data access speed. The bit line precharge is a technique to precharge a bit line to a predetermined voltage level prior to a data access in order to increase a data access speed.

In such an environment, the memory cells are arranged in a mesh form in which a plurality of word lines and a plurality of bit lines are crossed. A gate residue occurs due to a manufacturing process problem when the word lines and the bit lines are formed, causing a bridge phenomenon.

Figure 1A:
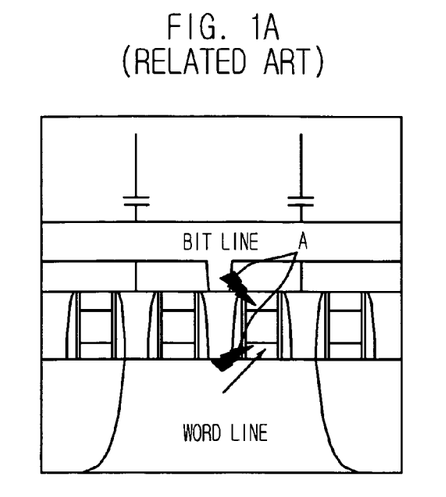
FIGS. 1A and 1B are diagrams illustrating the generation of a bridge between a word line and a bit line.
Figure 1B:
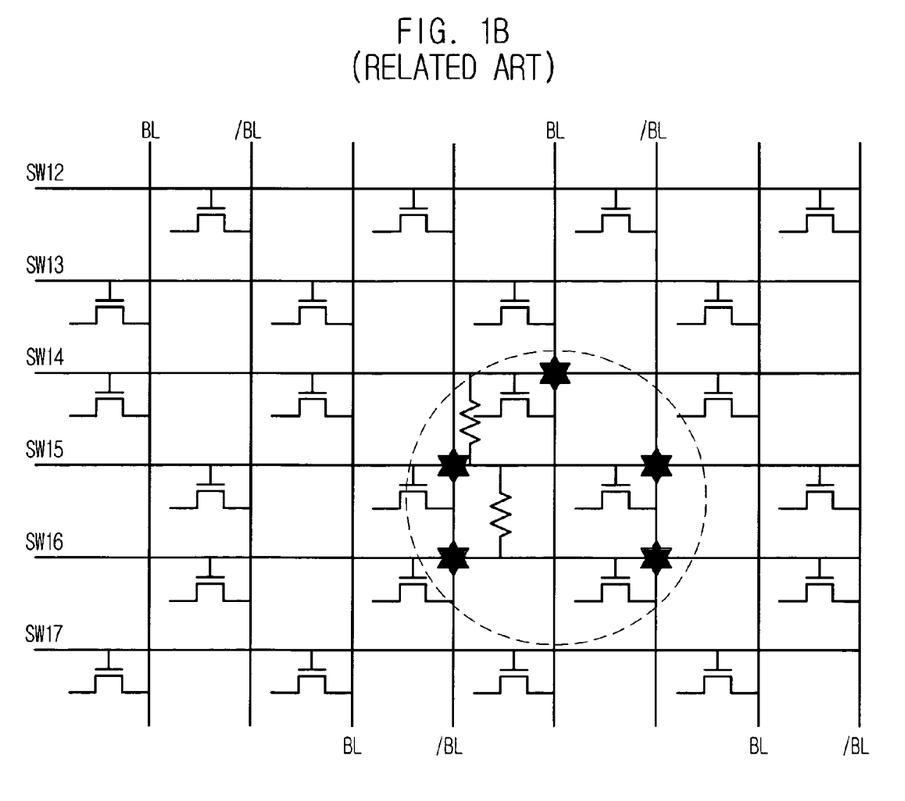

FIGS. 1A and 1B are diagrams illustrating the generation of a bridge between a word line and a bit line.

Referring to FIG. 1A, a bridge A is caused by a reduced gate pitch size.

The bridge A may be caused by a residue that is generated by a moat occurring during a shallow trench isolation (STI) process of forming a gate pattern for a word line, or may be caused when a gate shoulder portion is weakened during a process of forming a bit line contact.

One of the results of the bridge is a gate pattern failure.

The bridge serves as a resistive short between a word line and a bit line. The resistive short causes a bit line precharge voltage to leak out during a bit line precharge operation.

FIG. 1B illustrates various bridge resistances of the word line and the gate line because the gate pattern failure is different in size. When the semiconductor memory device is in a stand-by mode, a leakage current flowing from the bit line to the word line through the bridge having various resistances is in a range from several microamperes to several hundred microamperes.

Figure 2:
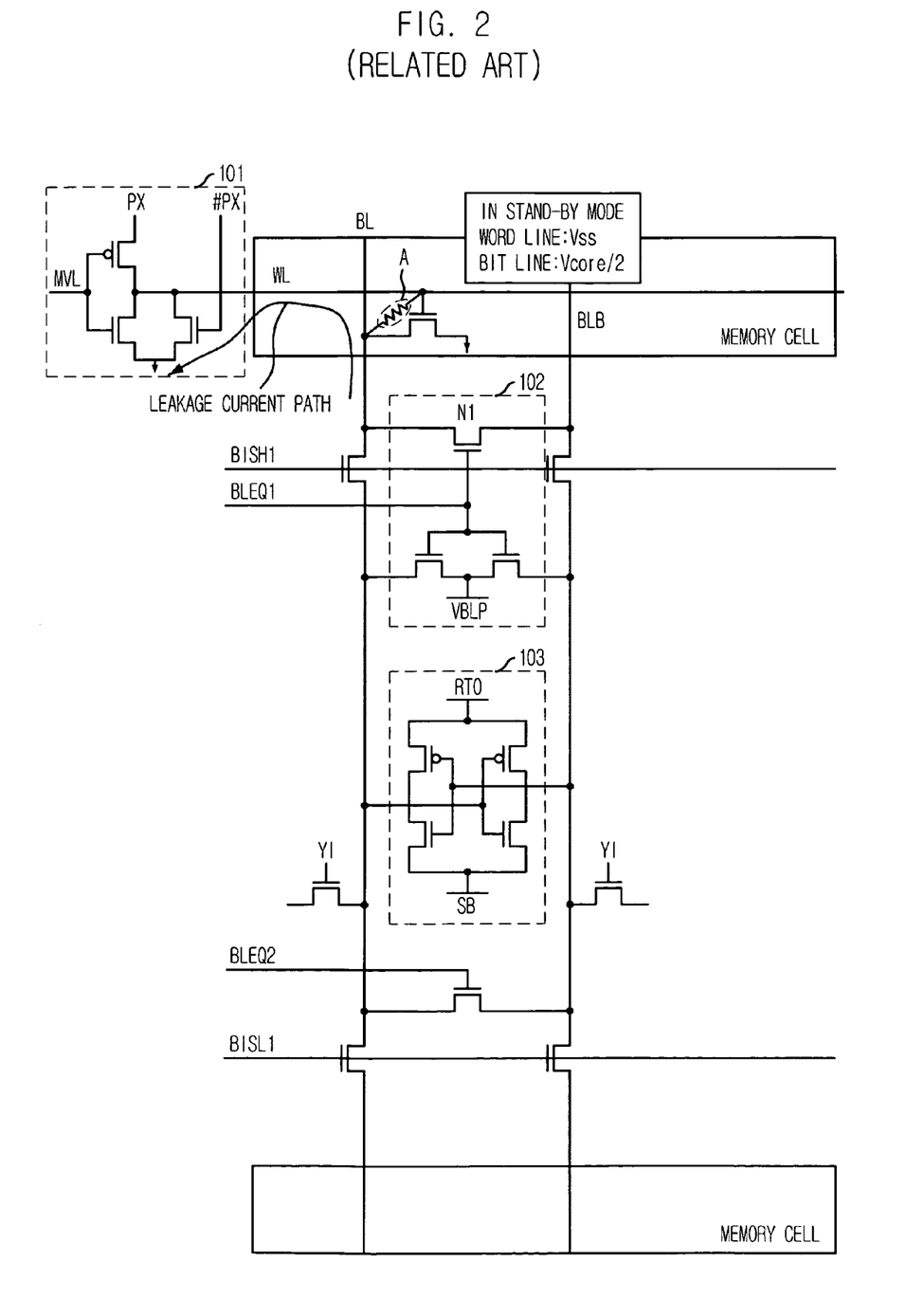
FIG. 2 is a circuit diagram illustrating a leakage phenomenon caused by a resistive short between a word line and a bit line.

FIG. 2 is a circuit diagram illustrating the leakage phenomenon caused by the resistive short between the word line and the bit line.

The resistive short occurs between the word line WL and the bit line BL due to the bridge A.

In this case, when the semiconductor memory device is in a stand-by mode, the word line WL and the bit lines BL and BLB maintain a ground voltage VSS and a half core voltage VCORE/2, respectively. Since a transistor N1 isolating the bit lines BL and BLB is turned on, a leakage current continuously flows from the bit lines BL and BLB to the word line WL. The half core voltage VCORE/2 is a bit line precharge voltage VBLP outputted from a precharge unit 102 to precharge the bit lines BL and BLB.

Such a manufacturing process problem increases the power consumption of the semiconductor memory device, degrading the power efficiency and performance of products.

In the case of a 32M-P Pseudo SRAM, a leakage current per bridge is approximately 9 μA and deceases the yield by approximately 6% in favorable conditions to approximately 40% in unfavorable conditions.

Figure 3:
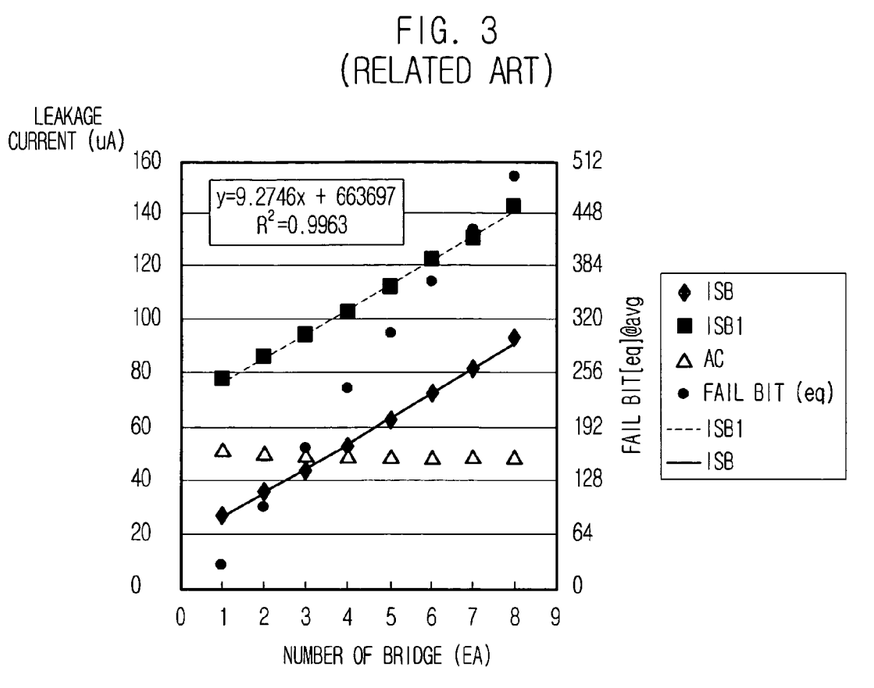
FIG. 3 is a graph illustrating the variation of a leakage current with respect to the number of bridges.

FIG. 3 is a graph illustrating the variation of a leakage current with respect to the number of bridges.

As the number of bridges increases, a current ISB in a stand-by mode and a current ISB1 in a self-refresh mode increases.

These leakage currents are a significant factor to decrease the yield because a low-power product has a 7-10% portion based on the stand-by current ISB versus 1 bridge.

To solve the leakage current problem, a voltage drop transistor having a fixed resistance is used.

However, since an amount of a leakage current is different according to the size of the gate pattern failure, it is difficult to solve the leakage current problem by using the conventional voltage drop transistor, a so-called bleeder. That is, the conventional drop transistor cannot cope with the bridge having various resistances.

SUMMARY OF THE INVENTION

It is, therefore, an object of the present invention to provide an internal voltage generator that can solve a leakage current problem caused by a bridge between a word line and a bit line in a power-down mode.

It is another aspect of the present invention to provide an internal voltage generator that can obtain a stable and reliable bit line precharge voltage when a power down mode is exited.

In accordance with an aspect of the present invention, there is provided an internal voltage generator including: an output node; a bit line precharge voltage generating unit for generating a bit line precharge voltage; and a voltage drop block for dropping a voltage level of the bit line precharge voltage according to operating modes.

In accordance with another aspect of the present invention, there is provided a method for driving an internal voltage generator, including: dropping a bit line precharge voltage by a first voltage drop level in a normal mode, and outputting the dropped voltage to a bit line precharge voltage supply terminal; and dropping the bit line precharge voltage by a second voltage drop level in a power down mode, and outputting the dropped voltage to the bit line precharge voltage supply terminal, the second voltage drop level being greater than the first voltage drop level.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

An internal voltage generator in accordance with exemplary embodiments of the present invention will be described in detail with reference to the accompanying drawings.

Figure 4:
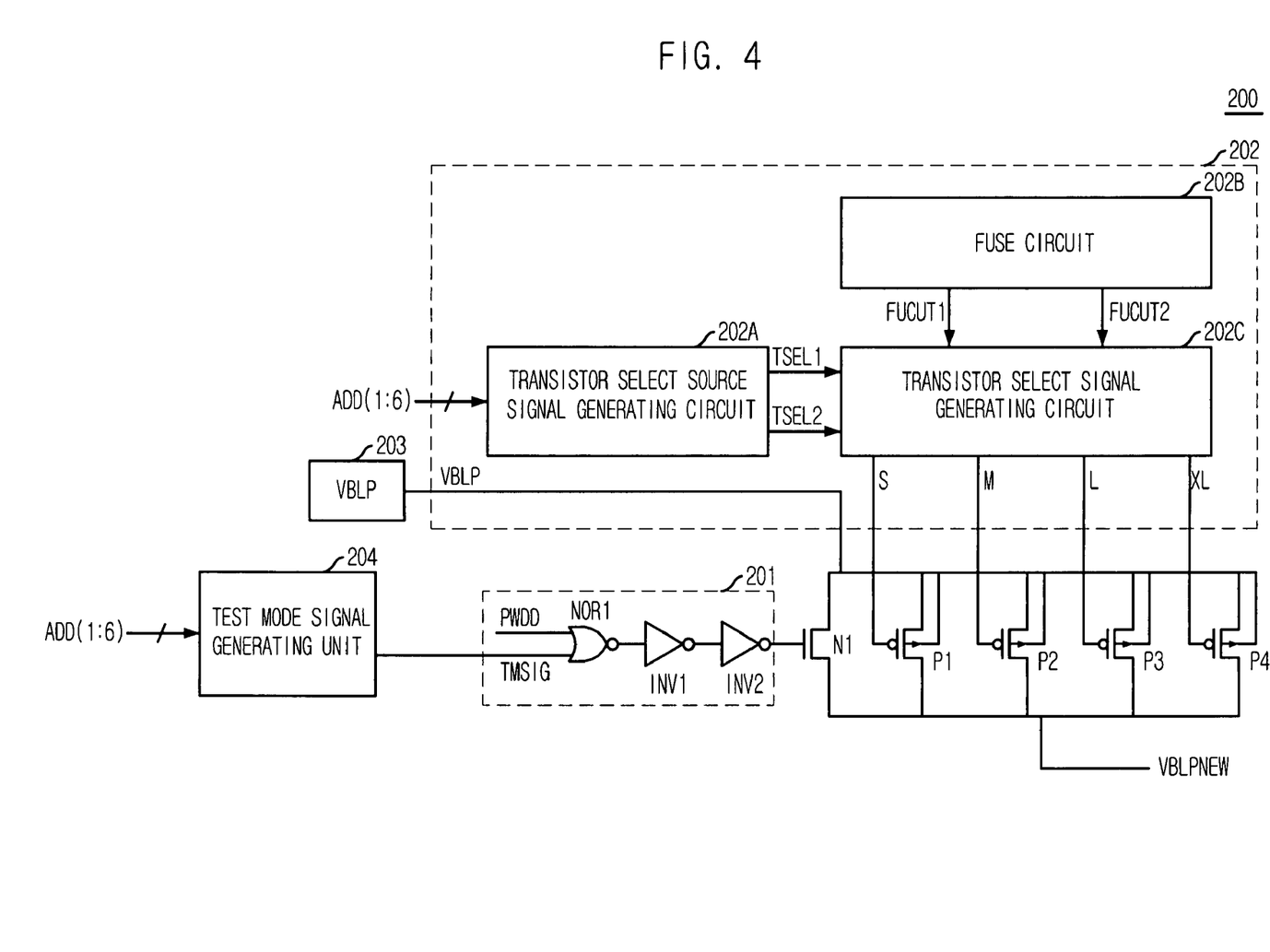
FIG. 4 is a circuit diagram of a bit line precharge voltage generator in accordance with an embodiment of the present invention.

FIG. 4 is a circuit diagram of a bit line precharge voltage generator in accordance with an embodiment of the present invention.

The bit line precharge voltage generator 200 outputs a bit line precharge voltage VBLPNEW having different voltage levels according to a power down mode and a non power down mode.

The bit line precharge voltage generator 200 includes an NMOS transistor N1, a mode determining unit 201, a plurality of voltage drop transistors P1 to P4, a voltage drop transistor driving unit 202, and a precharge voltage generating unit 203. The NMOS transistor N1 outputs a bit line precharge voltage VBLPNEW in a normal mode, and the mode determining unit 201 determines a power down mode and a non power down mode in response to a power down mode signal PWDD and a test mode signal TMSIG. The plurality of voltage drop transistors P1 to P4 have different resistances in the power down mode and output the bit line precharge voltage VBLPNEW having different voltage levels. The voltage drop transistor driving unit 202 selectively drives the voltage drop transistors P1 to P4, and the precharge voltage generating unit 203 outputs a half core voltage VCORE/2.

The bit line precharge voltage generator 200 further includes a test mode signal generating unit 204 that outputs the test mode signal TMSIG for selecting an amount of voltage drop according to a leakage current. The test mode signal TMSIG is a signal used to check if the bit line precharge voltage VBLPNEW is substantially dropped.

An output signal of the mode determining unit 201, which is inputted to a gate of the NMOS transistor N1, has a high voltage (VPP) level in order to prevent an output signal of the NMOS transistor N1 from being dropped by its threshold voltage (Vt). Alternatively, the NMOS transistor N1 is provided with a slim transistor having a low threshold voltage.

The mode determining unit 201 includes a first NOR gate NOR1 receiving the power down mode signal PWDD and the test mode signal TMSIG, and a buffer INV1 and INV2 buffering an output signal of the first NOR gate NOR1.

The voltage drop transistors P1 to P4 are PMOS transistors having different gate lengths. In FIG. 4, the first PMOS transistor P1 has the smallest gate length and the fourth PMOS transistor P4 has the greatest gate length.

Figure 5A:
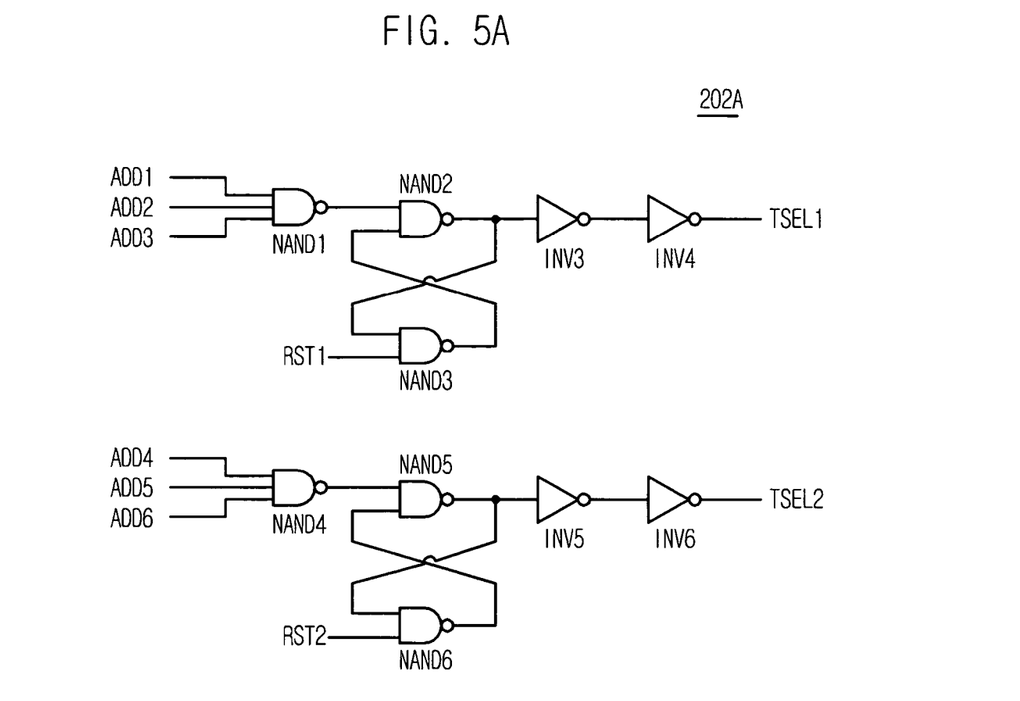
FIGS. 5A to 5C are circuit diagrams of a voltage drop transistor driving unit shown in FIG. 4.
Figure 5B:
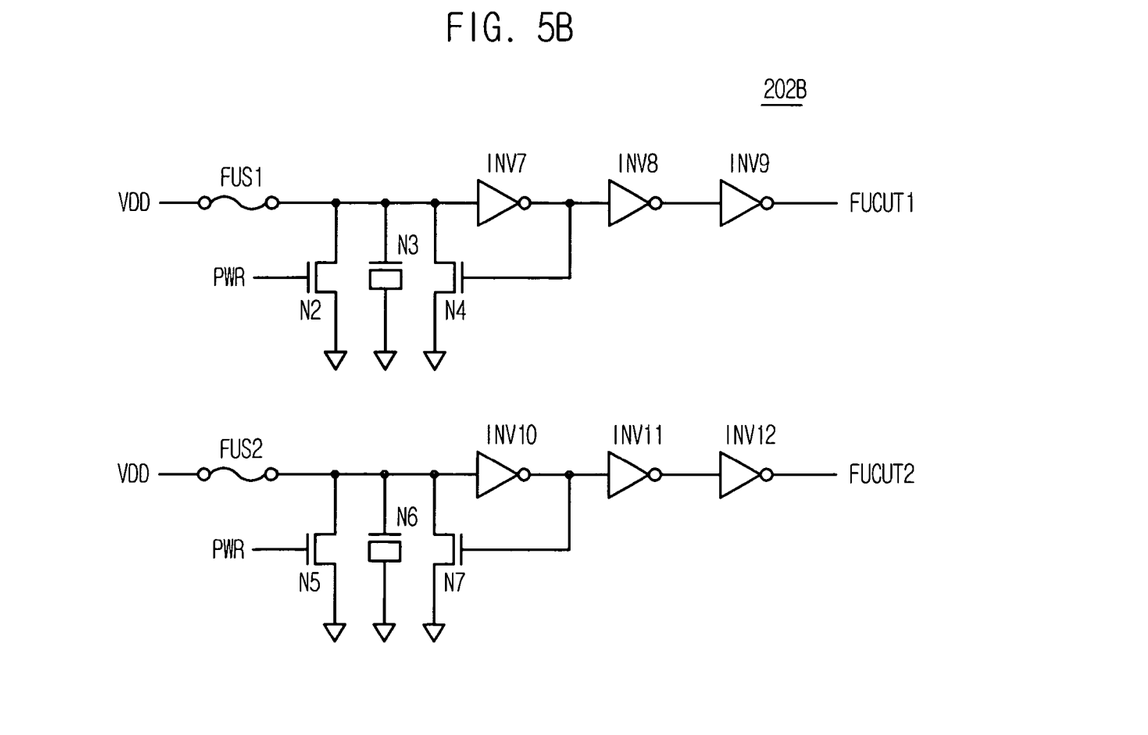
Figure 5C:
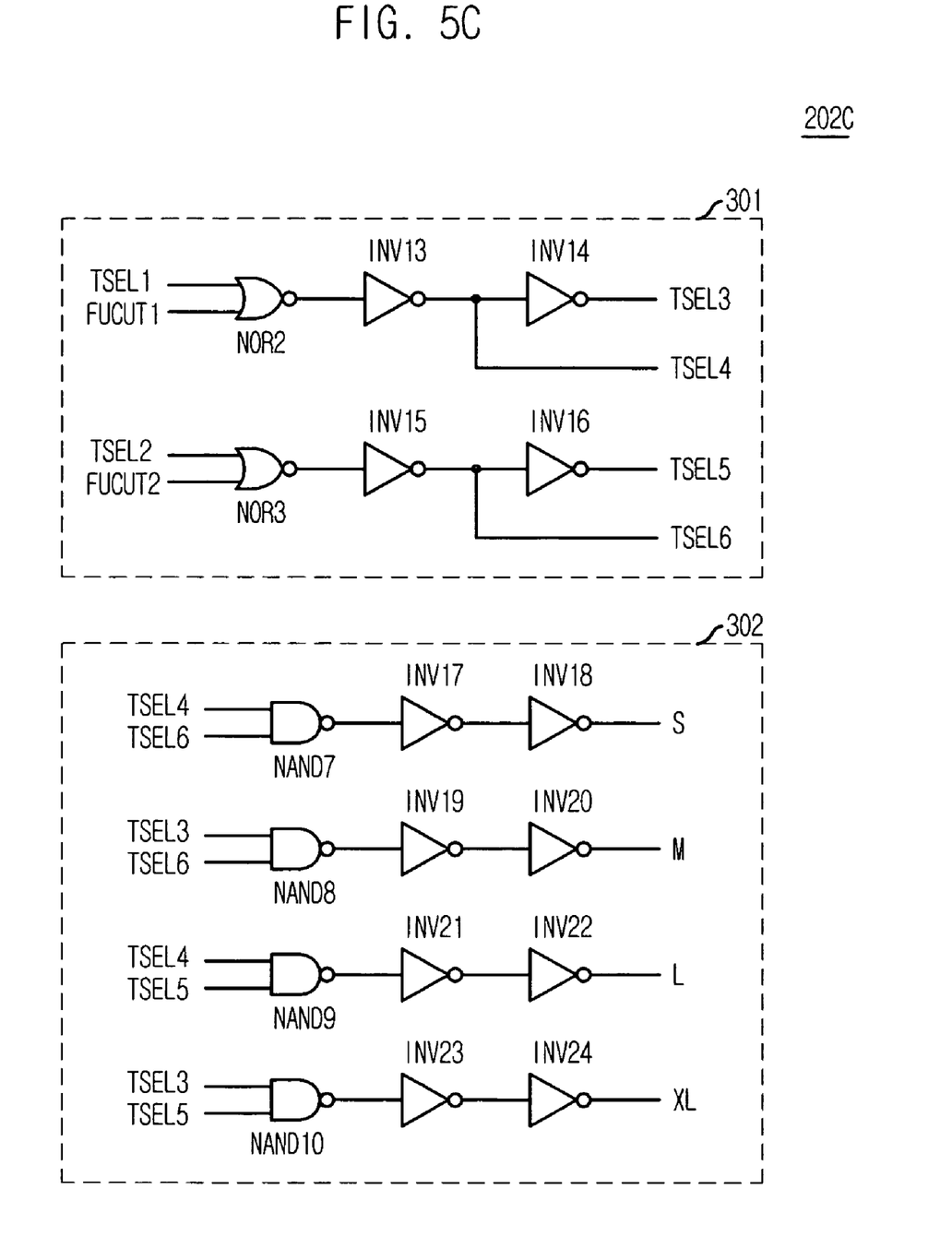

FIGS. 5A to 5C are circuit diagrams of the voltage drop transistor driving unit 202 shown in FIG. 4.

The voltage drop transistor driving unit 202 includes a transistor select source signal generating circuit 202A, a fuse circuit 202B, and a transistor select signal generating circuit 202C.

Referring to FIG. 5A, the transistor select source signal generating circuit 202A outputs first and second transistor select source signals TSEL1 and TSEL2 in response to different address signals ADD1 to ADD6.

A circuit configuration for generating the first transistor select source signal TSEL1 will be described in more detail.

A first NAND gate NAND1 receives three different address signals ADD1 to ADD3, and a second NAND gate NAND2 receives an output signal of the first NAND gate NAND1 as a first input signal. A third NAND gate NAND3 receives an output signal of the second NAND gate NAND2 as a first input signal and a first reset signal RST1 as a second input signal and outputs a NANDed signal as a second input signal of the second NAND gate NAND2. A buffer INV3 and INV4 buffers an output signal of the second NAND gate NAND2 to output the first transistor select source signal TSEL1.

A circuit configuration for generating the second transistor select source signal TSEL2 is the same as the circuit configuration for generating the first transistor select source signal TSEL1, except for the inputted address signals ADD4 to ADD6.

Referring to FIG. 5B, the fuse circuit 202B outputs first and second fuse cut signals FUCUT1 and FUCUT2 for selectively cutting the transistor select source signals TSEL1 and TSEL2.

A circuit configuration for generating the first fuse cut signal FUCUT1 will be described in more detail. A first fuse FUS1 cuts a power voltage (VDD) transmission line, and a second NMOS transistor N2 changes the fuse cut signal FUCUT1 to a logic low level in response to a power-up signal PWR. A stabilization circuit N3, N4 and INV7 outputs a stabilized fuse cut signal FUCUT1. A first buffer INV8 and INV9 buffers an output signal of the seventh inverter INV7 to output the first fuse cut signal FUCUT1.

A circuit configuration for generating the second fuse cut signal FUCUT2 is the same as the circuit configuration for generating the first fuse cut signal FUCUT1.

Referring to FIG. 5C, the transistor select signal generating circuit 202C includes a signal dividing unit 301 and a signal generating unit 302. The signal dividing unit 301 receives the 2-bit transistor select source signals TSEL1 and TSEL2 to output 4-bit transistor select source signals TSEL3 to TSEL6 in response to the fuse cut signals FUCUT1 and FUCUT2. The signal generating unit 302 outputs signals S, M, L and XL for driving the voltage drop transistors P1 to P4 in response to the transistor select source signals TSEL3 to TSEL6.

The signal dividing unit 301 includes a second NOR gate NOR2 receiving the first transistor select source signal TSEL1 and the first fuse cut signal FUCUT1, a thirteenth inverter INV13 inverting an output signal of the second NOR gate NOR2 to output the fourth transistor select source signal TSEL4, a fourteenth inverter INV14 inverting an output signal of the thirteenth inverter INV13 to output the third transistor select source signal TSEL3, a third NOR gate NOR3 receiving the second transistor select source signal TSEL2 and the second fuse cut signal FUCUT2, a fifteenth inverter INV15 inverting an output signal of the third NOR gate NOR3 to output the sixth transistor select source signal TSEL6, and a sixteenth inverter INV16 inverting an output signal of the fifteenth inverter INV15 to output the fifth transistor select source signal TSEL5.

In the signal generating unit 302, a seventh NAND gate NAND7 receives the fourth transistor select source signal TSEL4 and the sixth transistor select source signal TSEL6. A buffer INV17 and INV18 buffers an output signal of the seventh NAND gate NAND7 to output the first transistor select signal S.

An eighth NAND gate NAND8 receives the third transistor select source signal TSEL3 and the sixth transistor select source signal TSEL6. A buffer INV19 and INV20 buffers an output signal of the eighth NAND gate NAND8 to output the second transistor select signal M.

A ninth NAND gate NAND9 receives the fourth transistor select source signal TSEL4 and the fifth transistor select source signal TSEL5. A buffer INV21 and INV22 buffers an output signal of the ninth NAND gate NAND9 to output the third transistor select signal L.

A tenth NAND gate NAND10 receives the third transistor select source signal TSEL3 and the fifth transistor select source signal TSEL5. A buffer INV23 and INV24 buffers an output signal of the tenth NAND gate NAND10 to output the fourth transistor select signal XL.

Figure 6:
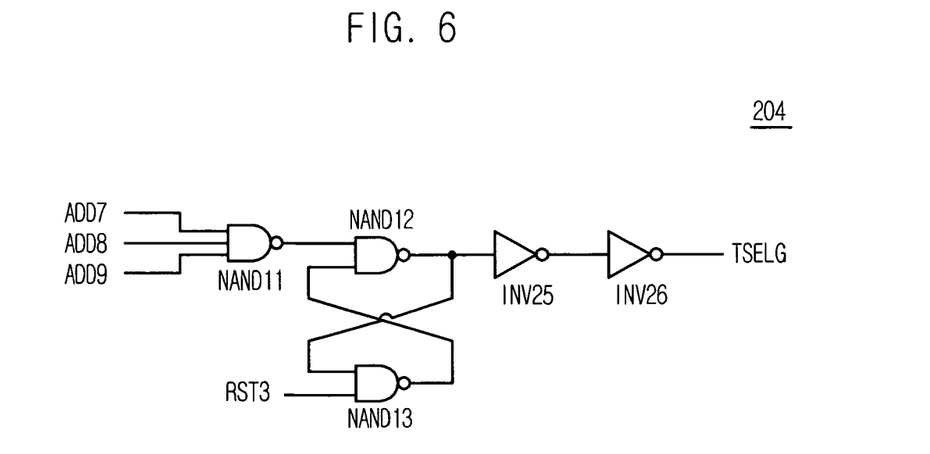
FIG. 6 is a circuit diagram of a test mode signal generating unit shown in FIG. 4.

FIG. 6 is a circuit diagram of the test mode signal generating unit 204 shown in FIG. 4.

The test mode signal generating unit 204 includes an eleventh NAND gate NAND11 receiving three different address signals ADD7 to ADD9, a twelfth NAND gate NAND12 receiving an output signal of the eleventh NAND gate NAND11 as a first input signal, a thirteenth NAND gate NAND13 receiving an output signal of the twelfth NAND gate NAND12 as a first input signal and a reset signal RST3 as a second signal and outputting a NANDed signal as a second input signal of the twelfth NAND gate NAND12, and a buffer INV25 and INV26 buffering the output signal of the twelfth NAND gate NAND12.

In a test mode, the bit line precharge voltage generator 200 turns off the NMOS transistor N1 for transferring the bit line precharge voltage VBLP and selectively turns on the voltage drop transistors P1 to P4 having the different gate lengths during a normal operation mode. This operation can obtain the same effect as varying the resistance, thereby solving the leakage current problem. The turning-on of the voltage drop transistors P1 to P4 is selected through the fuse cut when the amount of the leakage current is minimized in the power down mode through the test mode.

When the semiconductor memory device enters the power down mode, the NMOS transistor N1 transfers the bit line precharge voltage VBLP to the supply source through the voltage drop transistors P1 to P4 selected when the NMOS transistor N1 is turned off.

In the normal operation mode, the bit line precharge voltage VBLP is transferred to the supply source through the NMOS transistor N1, and the selected voltage drop transistors P1 to P4 are also turned on. That is, the voltage drop transistors P1 to P4 selected in the normal operation mode and the power down mode are turned on. The NMOS transistor N1 is a thick transistor and is driven at a relatively higher voltage (VPP) than the bit line precharge voltage VBLP.

Figure 7:
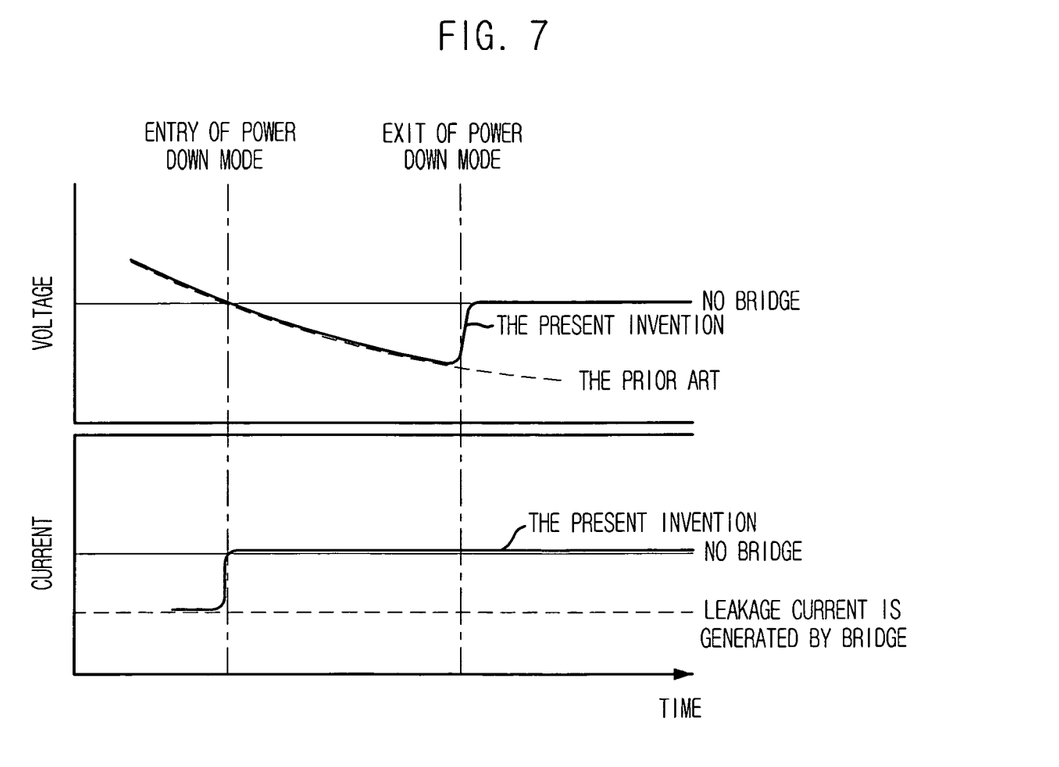
FIG. 7 is a graph illustrating a leakage current reduced by the bit line precharge voltage generator of FIG. 4.

FIG. 7 is a graph illustrating a leakage current reduced by the bit line precharge voltage generator 200 of FIG. 4.

A current-time graph shows an amount of a leakage current and a voltage-time graph shows a voltage level of the bit line precharge voltage.

As can be seen from the current-time graph, the amount of the leakage current is reduced in the power down mode by the bit line precharge voltage generator of the present invention, thereby causing no bridges.

As can be seen from the voltage-time graph, the conventional bleeder using a fixed resistance for solving the leakage current problem cannot increase up to the voltage level of the desired bit line precharge voltage VBLP even when the power down mode is exited. However, the bit line precharge voltage generator of the present invention obtains the desired bit line precharge voltage VBLP because it can transfer the bit line precharge voltage VBLP due to the NMOS transistor N1.

As described above, the bit line precharge voltage generator drives the bit line precharge voltage at a drivability adjusted in the power down mode through the test mode, thereby reducing the leakage current caused by the bridge between the word line and the bit line.

In addition, the malfunction of the semiconductor memory device can be prevented by obtaining the stable and reliable bit line precharge voltage for precharging the bit line and the power line of the bit line sense amplifier.

Consequently, the semiconductor memory device can operate reliably and stably at low power.

The present application contains subject matter related to Korean patent application No. 2006-59261, filed in the Korean Intellectual Property Office on Jun. 29, 2006, the entire contents of which are incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An internal voltage generator, comprising:
    an output node;
    a bit line precharge voltage generating unit for generating a bit line precharge voltage;
    a first voltage drop unit for dropping the voltage level of the bit line precharge voltage by a first voltage level in a normal mode to output the dropped voltage to the output node;
    a second voltage drop unit for dropping the voltage level of the bit line precharge voltage by a second voltage level in a power down mode to output the dropped voltage to the output node, the second voltage level being greater than the first voltage level, the second voltage drop unit including a plurality of voltage drop transistors connected in parallel between the output node and the bit line precharge voltage generating unit;
    a first control unit for controlling the first voltage drop unit in response to a mode determining signal; and
    a second control unit for controlling the second voltage drop unit in response to a plurality of transistor select signals for driving the plurality of voltage drop transistors, wherein the first control unit turns off the first voltage drop unit in power down mode.

2. The internal voltage generator of claim 1, wherein the plurality of voltage drop transistors are PMOS transistors having different gate lengths.

3. The internal voltage generator of claim 1, wherein the first voltage drop unit includes a thick NMOS transistor.

4. The internal voltage generator of claim 1, wherein the first voltage drop unit includes a slim NMOS transistor having a low threshold voltage.

5. The internal voltage generator of claim 1, wherein the first control unit includes:
    a NOR gate configured to receive a power down mode signal and a test mode signal; and
    a buffer for buffering an output signal of the NOR gate and outputting the mode determining signal to the first voltage drop unit.

6. The internal voltage generator of claim 1, wherein the test mode signal is outputted from a test mode signal generating unit provided for selecting an amount of a voltage drop according to a leakage current.

7. The internal voltage generator of claim 1, wherein the second control unit includes:
    a source signal generating circuit for generating a plurality of transistor select source signals used as source signals for selecting the plurality of voltage drop transistors;

a fuse circuit for controlling a transfer of the transistor select source signals through a fuse cutting; and a transistor select signal generating circuit for generating the plurality of transistor select signals in response to the transistor select source signals.

8. The internal voltage generator of claim 7, wherein the source signal generating circuit includes:

a first source signal generating circuit for generating a first transistor select source signal; and a second source signal generating circuit for generating a second transistor select source signal.

9. The internal voltage generator of claim 8, wherein the first source signal generating circuit includes:

a first NAND gate configured to receive three different address signals;

a second NAND gate configured to receive an output signal of the first NAND gate as a first input signal;

a third NAND gate configured to receive an output signal of the second NAND gate as a first input signal and a reset signal as a second input signal and output a NANDed signal as a second input signal of the second NAND gate; and a buffer for buffering the output signal of the second NAND gate to output the first transistor select source signal.

10. The internal voltage generator of claim 8, wherein the second source signal generating circuit includes:

a first NAND gate configured to receive three different address signals;

a second NAND gate configured to receive an output signal of the first NAND gate as a first input signal;

a third NAND gate configured to receive an output signal of the second NAND gate as a first input signal and a reset signal as a second input and output a NANDed signal as a second input signal of the second NAND gate; and a buffer for buffering the output signal of the second NAND gate to output the second transistor select source signal.

11. The internal voltage generator of claim 8, wherein the fuse circuit includes:

a first fuse cut signal generating circuit for generating a first fuse cut signal to output a selected logic level according to the fuse cuffing; and a second fuse cut signal generating circuit for generating a second fuse cut signal to output a selected logic level according to the fuse cutting.

12. The internal voltage generator of claim 11, wherein the first fuse cut signal generating circuit includes:

a first fuse connected to a power voltage;

an NMOS transistor for changing a logic level of an output signal of the first fuse in response to a power-up signal;

a stabilization circuit for stabilizing the output signal of the first fuse; and a buffer for buffering an output signal of the stabilization circuit to output the first fuse cut signal.

13. The internal voltage generator of claim 11, wherein the second fuse cut signal generating circuit includes:

a second fuse connected to a power voltage;

an NMOS transistor for changing a logic level of an output signal of the second fuse in response to a power-up signal;

a stabilization circuit for stabilizing the output signal of the second fuse; and a buffer for buffering an output signal of the stabilization circuit to output the second fuse cut signal.

14. The internal voltage generator of claim 11, wherein the transistor select signal generating circuit includes:

a first signal dividing circuit for transferring the first transistor select source signal in response to the first fuse cut signal to output third and fourth transistor select source signals;

a second signal dividing circuit for transferring the second transistor select source signal in response to the second fuse cut signal to output fifth and sixth transistor select source signals; and a signal generating circuit for generating the plurality of transistor select signals in response to the third to sixth transistor select source signals.

15. The internal voltage generator of claim 14, wherein the first signal dividing circuit includes:

a NOR gate configured to receive the first transistor select source signal and the first fuse cut signal;

a first inverter for inverting an output signal of the NOR gate to output the fourth transistor select source signal; and a second inverter for inverting an output signal of the first inverter to output the third transistor select source signal.

16. The internal voltage generator of claim 14, wherein the second signal dividing circuit includes:

a NOR gate configured to receive the second transistor select source signal and the second fuse cut signal;

a first inverter for inverting an output signal of the NOR gate to output the sixth transistor select source signal; and a second inverter for inverting an output signal of the first inverter to output the fifth transistor select source signal.

17. The internal voltage generator of claim 14, wherein the signal generating circuit includes:

a first transistor select signal generating circuit for generating the first transistor select signal for driving a first voltage drop transistor in response to the fourth and sixth transistor select source signals;

a second transistor select signal generating circuit for generating the second transistor select signal for driving a second voltage drop transistor in response to the third and the sixth transistor select source signals;

a third transistor select signal generating circuit for generating the third transistor select signal for driving a third voltage drop transistor in response to the fourth and the fifth transistor select source signals; and a fourth transistor select signal generating circuit for generating the fourth transistor select signal for driving a fourth voltage drop transistor in response to the third and the fifth transistor select source signals.

18. The internal voltage generator of claim 17, wherein the first transistor select signal generating circuit includes:

a NAND gate configured to receive the fourth and the sixth transistor select source signals; and a buffer for buffering an output signal of the NAND gate to output the first transistor select signal.

19. The internal voltage generator of claim 17, wherein the second transistor select signal generating circuit includes:

a NAND gate configured to receive the third and the sixth transistor select source signals; and a buffer for buffering an output signal of the NAND gate to output the second transistor select signal.

20. The internal voltage generator of claim 17, wherein the third transistor select signal generating circuit comprises:

a NAND gate configured to receive the fourth and the fifth transistor select source signals; and a buffer for buffering an output signal of the NAND gate to output the third transistor select signal.

21. The internal voltage generator of claim 17, wherein the fourth transistor select signal generating circuit comprises:
a NAND gate configured to receive the third and the fifth transistor select source signals; and
a buffer for buffering an output signal of the NAND gate to output the fourth transistor select signal.

* * * * *